United States Patent
Ogawara (10) Patent No.: US 9,606,496 B2
(45) Date of Patent: Mar. 28, 2017

(54) PRINTED CIRCUIT BOARD AND IMAGE FORMING APPARATUS

(71) Applicant: CANON KABUSHIKI KAISHA, Tokyo (JP)

(72) Inventor: Satoshi Ogawara, Koshigaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 180 days.

(21) Appl. No.: 14/326,193

(22) Filed: Jul. 8, 2014

(65) Prior Publication Data

US 2015/0027766 A1 Jan. 29, 2015

(30) Foreign Application Priority Data

Jul. 26, 2013 (JP) .................................. 2013-155726

(51) Int. Cl.
*H05K 1/00* (2006.01)
*G03G 15/00* (2006.01)
*H05K 3/40* (2006.01)
*H05K 1/02* (2006.01)
*H05K 3/34* (2006.01)

(52) U.S. Cl.
CPC ........... *G03G 15/80* (2013.01); *H05K 3/4015* (2013.01); *H05K 1/0254* (2013.01); *H05K 1/0269* (2013.01); *H05K 3/341* (2013.01); *H05K 3/3447* (2013.01); *H05K 2201/0394* (2013.01); *H05K 2201/09063* (2013.01); *H05K 2201/0969* (2013.01); *H05K 2201/1028* (2013.01); *H05K 2201/10257* (2013.01); *H05K 2201/10265* (2013.01); *H05K 2201/10295* (2013.01); *H05K 2201/10363* (2013.01)

(58) Field of Classification Search
CPC .... G03G 15/80; H05K 3/4015; H05K 1/0254; H05K 1/0269; H05K 3/341; H05K 3/3447
USPC .......................... 174/250, 255, 257, 258, 260
See application file for complete search history.

(56) References Cited

U.S. PATENT DOCUMENTS

2013/0140947 A1* 6/2013 Niiyama .............. H03H 9/0547
310/314

FOREIGN PATENT DOCUMENTS

JP 2002-158408 A 5/2002

* cited by examiner

*Primary Examiner* — Tremesha S Willis
(74) *Attorney, Agent, or Firm* — Fitzpatrick, Cella, Harper & Scinto (57) ABSTRACT

A printed circuit board, including: a substrate on which a component is mounted by solder; and a contact plate having a soldered portion soldered on the substrate, the contact plate being configured to be brought into contact with a contact of an apparatus to which the substrate is to be attached, wherein the soldered portion is soldered on a surface of the substrate opposite to a surface of the substrate on which the component is mounted, and wherein the contact plate has a suppressing portion configured to suppress an adhesion of a flux of the solder to a portion in which the contact plate is to be contacted by the contact, the suppressing portion making a flow path of the flux from the soldered portion to the portion longer than a straight-line distance from the soldered portion to the portion.

15 Claims, 7 Drawing Sheets

PRINTED CIRCUIT BOARD AND IMAGE FORMING APPARATUS

BACKGROUND OF THE INVENTION

Field of the Invention

The present invention relates to a printed circuit board and an image forming apparatus.

Description of the Related Art

As an electrophotographic image forming apparatus configured to form an image on a recording material, there is hitherto known a copying machine, a laser beam printer, and so on. A tandem type color copying machine is mentioned as an example of the electrophotographic image forming apparatus. The image forming apparatus is equipped with a power supply device, which converts an AC voltage supplied from a commercial power source into a DC voltage so as to supply power required for operating the image forming apparatus. When a high withstand voltage cable is used for connection between an output portion of a high voltage power supply substrate of the power supply device and each portion of a main body of the main body of the image forming apparatus, it takes much time for assembly in the factory, and cable cost is high. Therefore, there is proposed a structure of direct connection without using a cable, in which contacts are formed on the high voltage power supply substrate, and the high voltage power supply substrate is assembled to the main body of the image forming apparatus, so as to directly connect the contact portions of the high voltage power supply substrate to contacts of the image forming apparatus (Japanese Patent Application Laid-Open No. 2002-158408).

Figure 5A:
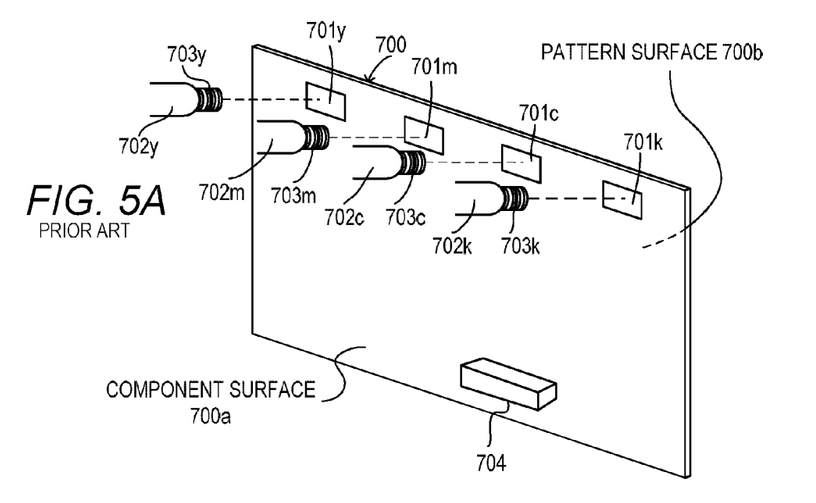
FIGS. 5A, 5B, and 5C are diagrams illustrating contact portions of a conventional high voltage power supply substrate.
Figure 5B:
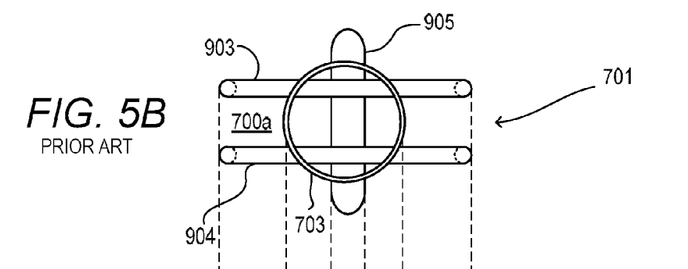
Figure 5C:
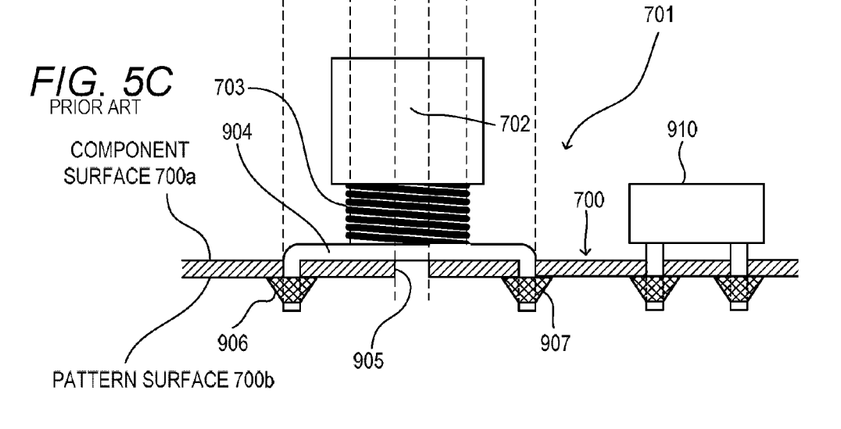
Figure 6A:
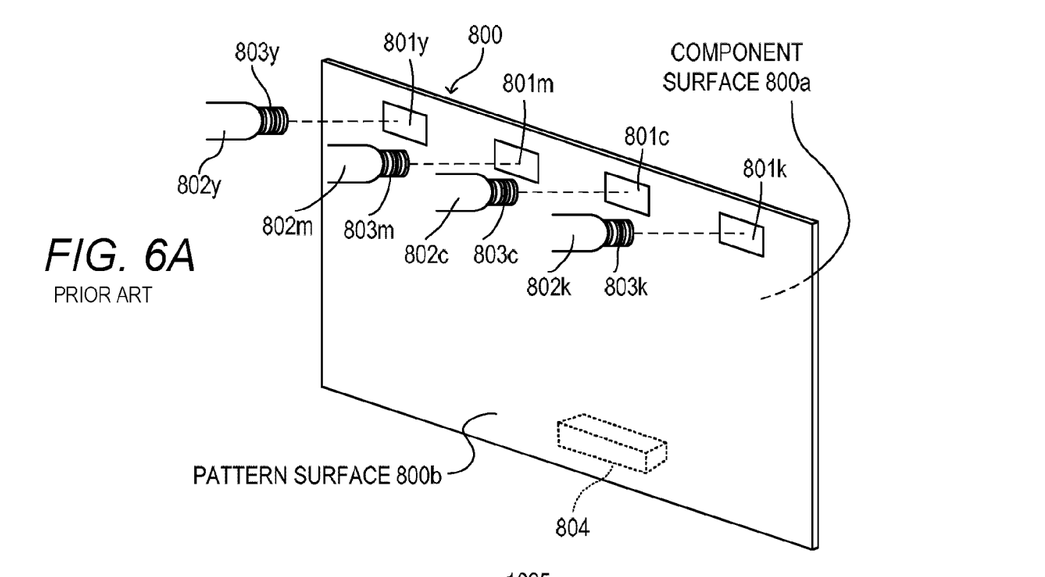
FIGS. 6A, 6B, and 6C are diagrams illustrating contact portions of a conventional high voltage power supply substrate.
Figure 6B:
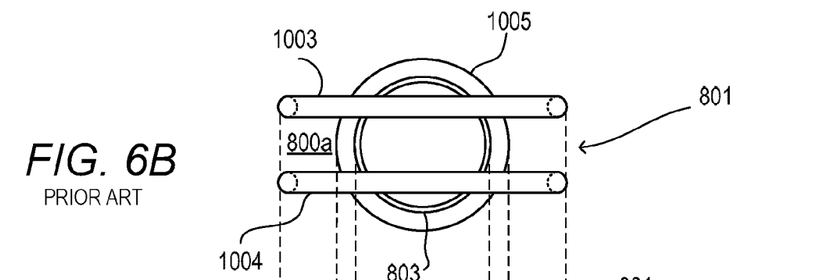
Figure 6C:
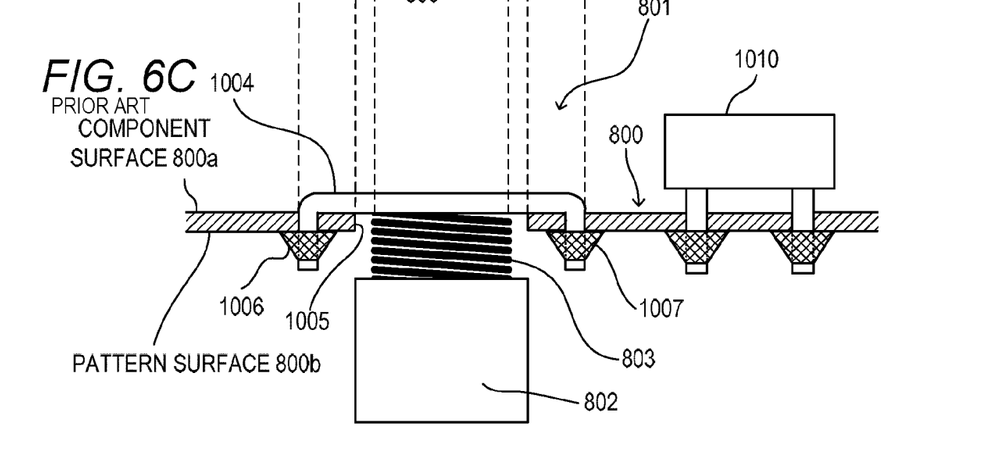

For instance, in a high voltage power supply substrate 700 as illustrated in FIGS. 5A, 5B, and 5C, contact portions 701 (701y, 701m, 701c, and 701k) and a signal connector 704 are provided on a component surface 700a of the high voltage power supply substrate 700. The high voltage power supply substrate 700 illustrated in FIG. 5A is assembled to the main body of the image forming apparatus so that the component surface 700a of the high voltage power supply substrate 700 is on a far side of the main body of the image forming apparatus while a pattern surface 700b of the high voltage power supply substrate 700 is on a near side of the main body of the image forming apparatus. Therefore, from the pattern surface 700b of the high voltage power supply substrate 700, an assembling worker needs to connect a signal wire to the signal connector 704 so that workability may be decreased and the working process may be made difficult. Therefore, there is proposed a high voltage power supply substrate 800 as illustrated in FIGS. 6A, 6B, and 6C, for example. However, in the high voltage power supply substrate 800 illustrated in FIG. 6A, spring contacts 803 (803y, 803m, 803c, and 803k) are brought into contact with jumper wires 1003 and 1004 from the side of a pattern surface 800b as illustrated in FIG. 6C. Therefore, the jumper wires 1003 and 1004 may come out from solder portions 1006 and 1007. Therefore, there is proposed a high voltage power supply substrate 900 as illustrated in FIG. 7B. In the high voltage power supply substrate 900 illustrated in FIG. 7B, even when a pressure force of a spring contact 913 is exerted on jumper wires 1103 and 1104, the jumper wires 1103 and 1104 do not come out from solder portions 1106 and 1107. Detailed descriptions of FIGS. 5A to 5C, 6A to 6C, and 7A to 7C will be provided later.

Figure 7A:
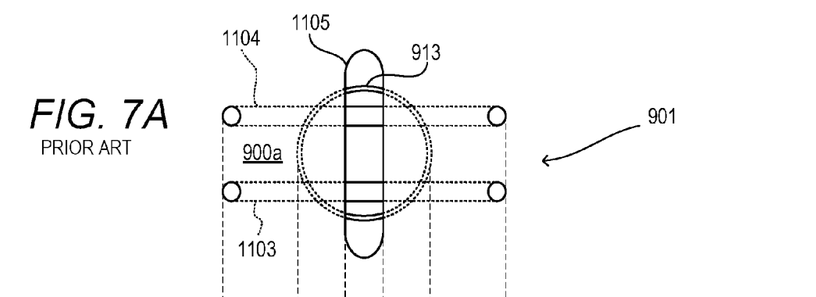
FIGS. 7A and 7B are diagrams illustrating contact portions of a conventional high voltage power supply substrate.
Figure 7B:
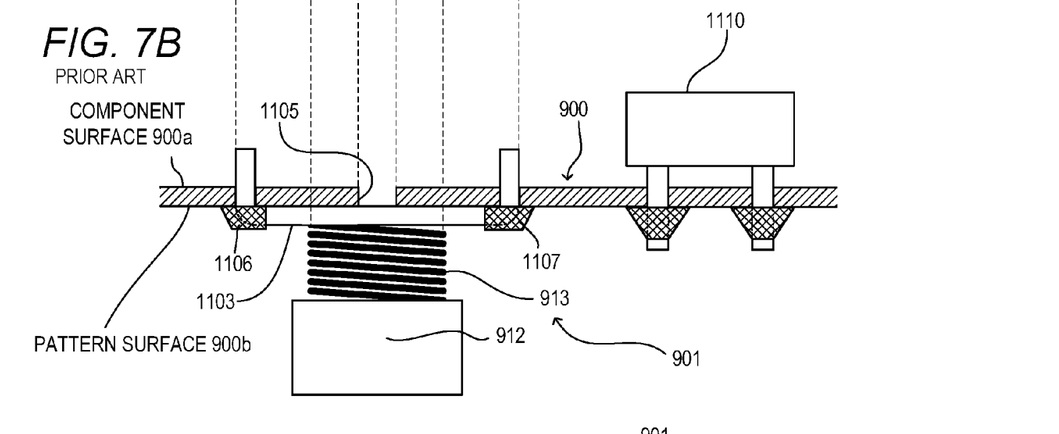

However, in FIG. 7A, the spring contact 913 of the main body of the image forming apparatus is brought into contact with the jumper wires 1103 and 1104 of the high voltage power supply substrate 900 on the side of a pattern surface 900b of the high voltage power supply substrate 900. In addition, the jumper wires 1103 and 1104 are soldered on the pattern surface 900b of the high voltage power supply substrate 900. In a case where the high voltage power supply substrate 900 is a single-sided substrate, it is necessary to manually solder the jumper wires 1103 and 1104 to the high voltage power supply substrate 900 to form the solder portions 1106 and 1107 after other components 1110 are soldered on the high voltage power supply substrate 900 through a so-called flow soldering process in which the substrate is caused to pass a solder bath filled with liquid solder.

Figure 7C:
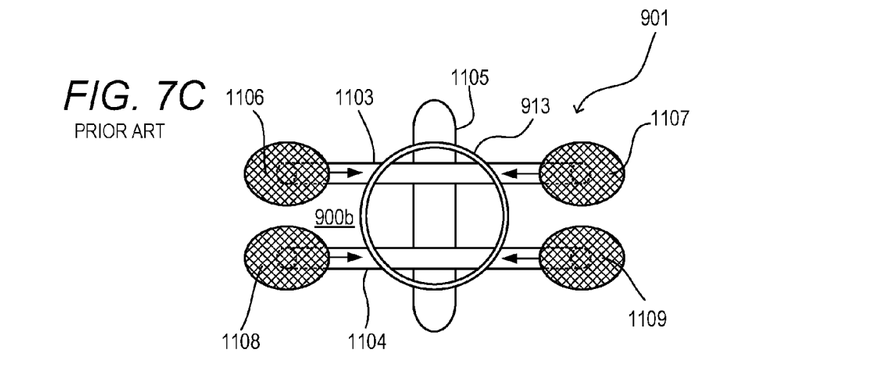
FIG. 7C is a diagram illustrating a flow of solder flux.

FIG. 7C is an enlarged view of a vicinity of the contact portion in the structure illustrated in FIG. 7A and FIG. 7B. When the jumper wires 1103 and 1104 are soldered on the high voltage power supply substrate 900, flux for solder (hereinafter referred to as solder flux) may flow from solder portions 1106, 1107, 1108, and 1109 along surfaces of the jumper wires 1103 and 1104 in directions indicated by the arrows. The solder flux is used for chemically removing an oxide film on a metal surface to be soldered to provide a metal surface for soldering. When the solder flux flows to portions of the jumper wires 1103 and 1104 contacting the spring contact 913, a good contact state between the spring contact 913 and the jumper wires 1103 and 1104 may not be secured. Then, a desired high voltage may not be supplied from the high voltage power supply substrate 900 to a load such as a primary transfer roller. As a countermeasure to this drawback, it is considered to provide a step of cleaning the solder flux adhered to the jumper wires 1103 and 1104. However, when the solder flux remains after the cleaning because of a variation of the cleaning work level, the good contact state between the spring contact 913 and the jumper wires 1103 and 1104 cannot be secured as described above. The problem that the good contact state of the spring contact cannot be secured because of a flow of the solder flux can also occur when the contact portion is formed by a contact plate instead of the jumper wire.

SUMMARY OF THE INVENTION

The present invention has been made in such circumstances, and the present invention avoids a contact failure of a contact by suppressing a flow and adhesion of a solder flux to the contact.

According to an embodiment of the present invention, there is provided a printed circuit board, including: a substrate on which a component is mounted by solder; and a contact plate including a soldered portion soldered on the substrate, the contact plate being configured to be brought into contact with a contact of an apparatus to which the substrate is to be attached, wherein the soldered portion is soldered on a surface of the substrate opposite to a surface of the substrate on which the component is mounted, and wherein the contact plate includes a suppressing portion configured to suppress an adhesion of a flux of the solder to a portion in which the contact plate is to be contacted by the contact, the suppressing portion making a flow path of the flux from the soldered portion to the portion longer than a straight-line distance from the soldered portion to the portion.

According to an embodiment of the present invention, there is provided an image forming apparatus configured to form an image on a recording material, the image forming apparatus including: an image bearing member; a charging unit configured to charge the image bearing member; a latent image forming unit configured to form a latent image on the image bearing member charged by the charging unit; a developing unit configured to develop the latent image into a toner image; a transfer unit configured to transfer the toner image developed by the developing unit onto the recording material; the above-mentioned printed circuit board; and a contact, wherein the printed circuit board is a high voltage power supply substrate configured to supply a high voltage to at least one of the charging unit, the developing unit, and the transfer unit, and wherein the printed circuit board is attached to a main body of the image forming apparatus so that, when the contact is connected to a contact plate of the printed circuit board, a surface of the printed circuit board opposite to a surface of the printed circuit board on which a component is mounted is on a far side of the main body of the image forming apparatus while the surface on which the component is mounted is on a near side of the main body of the image forming apparatus.

Further features of the present invention will become apparent from the following description of exemplary embodiments with reference to the attached drawings.

DESCRIPTION OF THE EMBODIMENTS

The embodiments of the present invention will hereinafter be described in detail in accordance with the accompanying drawings. In order to compare with the embodiments described later, the structure of the conventional printed circuit boards will be described.

Conventional High Voltage Power Supply Substrate

FIG. 5A is a perspective view illustrating a connection structure of a contact portion of a high voltage power supply substrate 700 including a high voltage power supply circuit configured to supply high voltages such as a charging voltage, a developing voltage, and a transferring voltage. Coil-spring-shaped spring contacts 703y, 703m, 703c, and 703k are provided in a main body of an image forming apparatus main body. Here, the spring contact 703y is connected to a primary transfer roller 105y described later, the spring contact 703m is connected to a primary transfer roller 105m, the spring contact 703c is connected to a primary transfer roller 105c, and the spring contact 703k is connected to a primary transfer roller 105k (see FIG. 1). The suffix "y" represents yellow color, the suffix "m" represents magenta color, the suffix "c" represents cyan color, and the suffix "k" represents black color. Contact support members 702y, 702m, 702c, and 702k (for more generally, 702) are made of an insulating material and support the spring contacts 703y, 703m, 703c, and 703k. In the following description, the suffixes "y", "m", "c", and "k" are omitted unless otherwise deemed necessary.

The high voltage power supply substrate 700 is a single-sided printed circuit board. On a surface (hereinafter referred to as a component surface) 700a of the high voltage power supply substrate 700 on which circuit components are mounted, four contact portions 701y, 701m, 701c, and 701k as primary transfer voltage output portions are disposed substantially along a straight line. On a surface (hereinafter referred to as a pattern surface) 700b of the high voltage power supply substrate 700 opposite to the component surface, a circuit pattern is formed. In addition, the high voltage power supply substrate 700 is provided with a signal connector 704. The signal connector 704 is connected to a signal wire configured to send and receive a signal for controlling the high voltage power supply substrate 700, a high voltage output detection signal, and so on from a control substrate (not shown) of an image forming apparatus 100. In FIG. 5A, the signal connector 704 is provided on the component surface on which the contact portions 701 are provided as well.

FIG. 5B is an enlarged view of a vicinity of the contact portion 701 of the high voltage power supply substrate 700. As illustrated in FIG. 5B, the contact portion 701 includes two jumper wires 903 and 904. An inspection hole (visible hole) 905 is provided in the high voltage power supply substrate 700 for visually inspecting whether or not the spring contact 703 and the jumper wires 903 and 904 are correctly connected to each other. The jumper wires 903 and 904 are supported on the component surface 700a of the high voltage power supply substrate 700 on which a component 910 is mounted, and are soldered on the high voltage power supply substrate 700 by solder portions 906 and 907 formed on the pattern surface 700b. FIG. 5B is a diagram of the high voltage power supply substrate 700 as viewed from the component surface 700a, and FIG. 5C is a diagram of the high voltage power supply substrate 700 as viewed from a cross-sectional direction. The contact portion 701 of the high voltage power supply substrate 700 includes the jumper wires 903 and 904 so that the spring contact 703 is connected to the jumper wires 903 and 904 while a contact state between the contact portion 701 and the jumper wires 903 and 904 is secured. The high voltage power supply substrate 700 having this structure is assembled to the main body of the image forming apparatus 100 so that the component surface 700a of the high voltage power supply substrate 700 is on a far side of the main body of the image forming apparatus 100 while the pattern surface 700b of the high voltage power supply substrate 700 is (facing outward) on a near side of the image forming apparatus 100. In this case, it is possible to visually inspect the contact state between the spring contact 703 and the jumper wires 903 and 904 from the pattern surface side of the high voltage power supply substrate 700 through the inspection hole 905 of the high voltage power supply substrate 700. In the structure illustrated in FIG. 5A, when the high voltage power supply substrate 700 is assembled to the main body of the image forming apparatus 100, an assembling worker connects the signal wire to the signal connector 704 from the side of the pattern surface 700*b* of the high voltage power supply substrate 700. Therefore, workability is decreased for the worker, and the connection work is difficult when a flat cable is used for the signal wire, for example.

FIG. 6A illustrates a connection structure of a contact portion 801 of a high voltage power supply substrate 800 that is aimed at solving the above-mentioned problem. The high voltage power supply substrate 800 is a single-sided printed circuit board. On a pattern surface 800*b* of the high voltage power supply substrate 800, four contact portions 801*y*, 801*m*, 801*c*, and 801*k* as the primary transfer voltage output portions are disposed substantially along a straight line. A component 1010 and the like are mounted on a component surface 800*a* of the high voltage power supply substrate 800 opposite to the pattern surface 800*b*. In FIG. 6A, a signal connector 804 is supported on the component surface 800*a*. In other words, in FIG. 6A, the signal connector 804 is provided on the component surface 800*a* which is opposite to the pattern surface 800*b* on which the contact portions 801 are provided. Spring contacts 803 are provided in the main body of the image forming apparatus 100. Contact support members 802 made of an insulating material support the spring contacts 803.

FIG. 6B is an enlarged view of a vicinity of the contact portion 801 of the high voltage power supply substrate 800. As illustrated in FIG. 6B, the contact portion 801 includes two jumper wires 1003 and 1004. An inspection hole 1005 is provided in the high voltage power supply substrate 800 for the worker to visually inspect whether or not the spring contact 803 and the jumper wires 1003 and 1004 are correctly connected to each other. The jumper wires 1003 and 1004 are mounted on the component surface 800*a* of the high voltage power supply substrate 800, and are soldered on the high voltage power supply substrate 800 by solder portions 1006 and 1007. FIG. 6B is a diagram of the high voltage power supply substrate 800 viewed from the component surface 800*a*, and FIG. 6C is a diagram of the high voltage power supply substrate 800 viewed from a cross-sectional direction. The contact portion 801 of the high voltage power supply substrate 800 includes the jumper wires 1003 and 1004 so that the spring contact 803 is connected to the jumper wires 1003 and 1004 while a contact state between the spring contact 803 and the jumper wires 1003 and 1004 is secured. The high voltage power supply substrate 800 having this structure is assembled to the main body of the image forming apparatus 100 so that the pattern surface 800*b* of the high voltage power supply substrate 800 is on the far side of the main body of the image forming apparatus 100 while the component surface 800*a* of the high voltage power supply substrate 800 is (facing outward) on the near side of the image forming apparatus. In this case, the spring contact 803 can be brought into contact with the jumper wires 1003 and 1004 through the inspection hole 1005 provided in the high voltage power supply substrate 800. In addition, it is possible to visually inspect the contact state between the spring contact 803 and the jumper wires 1003 and 1004 from the component surface 800*a* of the high voltage power supply substrate 800 through the inspection hole 1005 of the high voltage power supply substrate 800.

However, when the contact portion 801 of the high voltage power supply substrate 800 has the structure illustrated in FIG. 6C, a pressure force of the coil-spring-shaped spring contact 803 is exerted on the jumper wires 1003 and 1004. Therefore, the load due to the spring contact 803 is also exerted on the solder portions 1006 and 1007 of the jumper wires 1003 and 1004. Because the solder has a property of being continuously deformed (creep phenomenon) while the load is exerts on the solder, the jumper wires 1003 and 1004 may come out from the solder portions 1006 and 1007 with the passage of time.

Therefore, FIGS. 7A to 7C illustrate a structure example of a contact portion 901 in which jumper wires are used for the contact, and a load is prevented from being exerted on the solder portions of the jumper wires. As illustrated in FIGS. 7A to 7C, the contact portion 901 includes two jumper wires 1103 and 1104. An inspection hole 1105 is provided in a high voltage power supply substrate 900 for visually inspecting whether or not a spring contact 913 and the jumper wires 1103 and 1104 are correctly connected to each other. The jumper wires 1103 and 1104 are mounted on a pattern surface 900*b* which is opposite to a component surface 900*a* of the high voltage power supply substrate 900 on which a component 1110 is mounted, and are soldered on the high voltage power supply substrate 900 by solder portions 1106 and 1107. In addition, the spring contact 913 and a contact support member 912 configured to support the spring contact 913 are provided in the image forming apparatus 100.

FIG. 7A is a diagram of the high voltage power supply substrate 900 as viewed from the component surface 900*a*, and FIG. 7B is a diagram of the high voltage power supply substrate 900 as viewed from a cross-sectional direction. The contact portion 901 of the high voltage power supply substrate 900 includes the jumper wires 1103 and 1104, and the spring contact 913 is connected to the jumper wires 1103 and 1104 while a contact state between the spring contact 913 and the jumper wires 1103 and 1104 is secured. The high voltage power supply substrate 900 having this structure is assembled to the main body of the image forming apparatus 100 so that the pattern surface 900*b* of the high voltage power supply substrate 900 is on the far side of the main body of the image forming apparatus 100 while the component surface 900*a* of the high voltage power supply substrate 900 is (facing outward) on the near side of the image forming apparatus 100. In FIG. 7A, parts of the jumper wires 1103 and 1104 and the spring contact 913 indicated by broken lines are hidden by the high voltage power supply substrate 900 as viewed from the component surface 900*a* and are not actually seen from the component surface 900*a* of the high voltage power supply substrate 900. In this case, the contact state between the spring contact 913 and the jumper wires 1103 and 1104 can be visually inspected from the component surface 900*a* of the high voltage power supply substrate 900 through the inspection hole 1105 of the high voltage power supply substrate 900.

However, as described above, when the jumper wires 1103 and 1104 are soldered, flux for solder (hereinafter referred to as solder flux) flows from solder portions 1106, 1107, 1108, and 1109 along surfaces of the jumper wires 1103 and 1104 in directions indicated by the arrows. Then, when the solder flux flows to portions in which the jumper wires 1103 and 1104 are contacted by the spring contact 913 and is adhered to the spring contact 913, a good contact state between the spring contact 913 and the jumper wires 1103 and 1104 may not be secured. Therefore, it is desired that the flow and adhesion of the solder flux to the contact be suppressed so that a contact failure of the contact can be prevented.

First Embodiment (Structure of Image Forming Apparatus)

Figure 1:
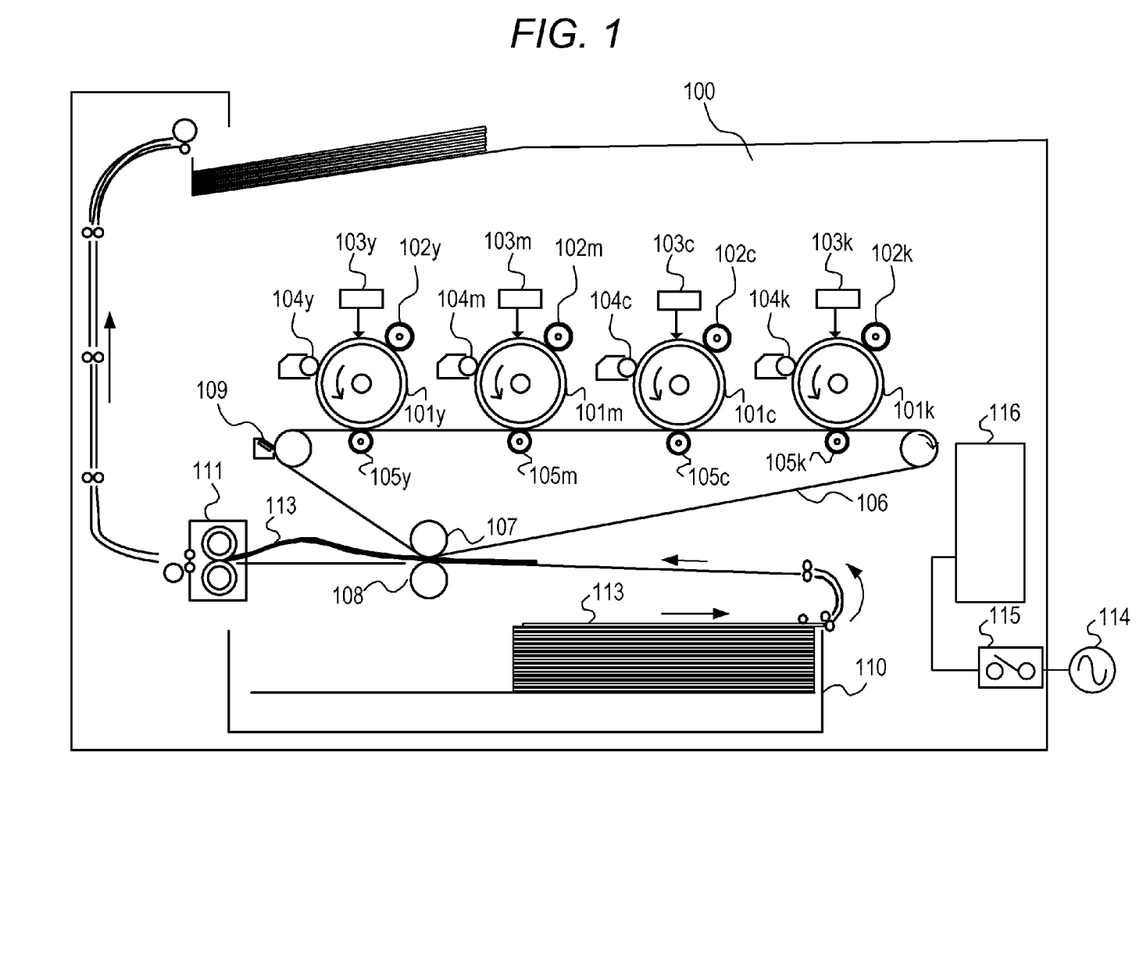
FIG. 1 is a schematic structural diagram of an image forming apparatus according to first to fourth embodiments.

FIG. 1 is a diagram illustrating a structure of a tandem type color copying machine as an example of the image forming apparatus 100 to which the printed circuit board according to a first embodiment is attached. The image forming apparatus 100 includes photosensitive drums 101 as image bearing members. The photosensitive drums 101 are rotated in a counterclockwise direction (in a direction indicated by the arrows in FIG. 1), and surfaces of the photosensitive drums 101 are uniformly charged by primary charging rollers 102 as charging units. The surfaces of the photosensitive drums 101 charged uniformly are irradiated with laser beams from laser units (latent image forming unit) 103, and the surfaces of the photosensitive drums 101 are exposed so that latent images are formed. When a photosensitive drum 101$y$ is rotated, a developing sleeve 104$y$ as a developing unit passes the surface of the photosensitive drum 101$y$ so that the latent image formed on the photosensitive drum 101$y$ (on the image bearing member) is developed by yellow color toner. Then, a yellow color toner image is formed on the surface of the photosensitive drum 101$y$. Next, the surface of the photosensitive drum 101$y$ is brought into contact with an intermediate transfer belt 106. Then, when a voltage is applied to the primary transfer roller 105$y$ as a transfer unit, the yellow color toner image formed on the surface of the photosensitive drum 101$y$ is transferred onto the surface of the intermediate transfer belt 106. In the same manner, a magenta color toner image, a cyan color toner image, and a black color toner image are transferred from the respective photosensitive drums 101 onto the surface of the intermediate transfer belt 106 so as to be sequentially superimposed.

Thus, a full color image composed of the yellow color toner, the magenta color toner, the cyan color toner, and the black color toner is formed on the intermediate transfer belt 106. Then, along with rotation of the intermediate transfer belt 106, the intermediate transfer belt 106 passes an inner secondary transfer roller 107 and an outer secondary transfer roller 108. At this time, a paper sheet 113 fed from a paper sheet cassette 110 is nipped between and conveyed by the intermediate transfer belt 106 and the outer secondary transfer roller 108. Thus, the full color image formed on the intermediate transfer belt 106 is transferred onto the surface of the paper sheet 113. The paper sheet 113 after passing between the inner secondary transfer roller 107 and the outer secondary transfer roller 108 is conveyed to a fixing unit 111 by which the paper sheet 113 is heated to high temperature. When the toner becomes soft, a pressure is applied so that the toner image is stuck and fixed to the surface of the paper sheet 113. The paper sheet 113 after the fixing process is further conveyed and discharged to the outside of the image forming apparatus 100 so as to be stacked. A belt cleaner 109 removes toner un-transferred onto the paper sheet 113 and remaining on the intermediate transfer belt 106.

A main switch 115 is a master switch of the image forming apparatus 100. When the main switch 115 is turned on, an AC voltage is supplied from a commercial power source 114 to an AC-DC power supply 116. The AC-DC power supply 116 is a power supply configured to operate the image forming apparatus 100. The AC-DC power supply 116 converts the AC voltage supplied from the commercial power source 114 into a DC voltage. Further, the AC-DC power supply 116 supplies electric power to individual components of the image forming apparatus 100 such as a motor configured to rotate the photosensitive drum 101, a high voltage power supply device, and a control unit configured to implement an image forming operation, which are required for operating the image forming apparatus 100.

Here, the primary charging roller 102, the developing sleeve 104, the primary transfer roller 105, and the outer secondary transfer roller 108 are supplied with high voltages from the individually-prepared high voltage power supply substrates. Here, as an example of the high voltage power supply substrates, a description will be provided of a high voltage power supply substrate including a high voltage power supply circuit configured to supply a high voltage to the primary transfer roller 105. As described above, when a cable (of high withstand voltage) is used for the power supply path from the output portion of the high voltage power supply substrate to the primary transfer roller 105 of the main body of the image forming apparatus 100, it takes much time for assembly in the factory, and cable cost is high. Therefore, there is a method of direct connection without using a cable, in which contact portions are provided on the high voltage power supply substrate, and the high voltage power supply substrate is assembled to the main body of the image forming apparatus 100, so as to directly connect the contact portions of the high voltage power supply substrate to contacts of the image forming apparatus 100.

(Structure of High Voltage Power Supply Substrate)

The printed circuit board of the embodiment will be described with reference to FIGS. 2A and 2B and FIG. 3. In the embodiment, a structure configured to suppress the flow of solder flux is provided in a portion of the contact plate so that, when the contact plate is soldered on the single-sided printed circuit board, the solder flux does not flow to a position in which the contact plate contacts the spring contact of the main body of the image forming apparatus. The method of attaching the high voltage power supply substrate to the main body of the image forming apparatus 100 is the same as the contact method described above with reference to FIG. 6A. In addition, in the high voltage power supply substrate of the embodiment, similarly to FIG. 7B, the contact plates are provided on the pattern surface which is opposite to the component surface on which the components are mounted.

(Structure of Contact Plate Supporting Portion)

Figure 2A:
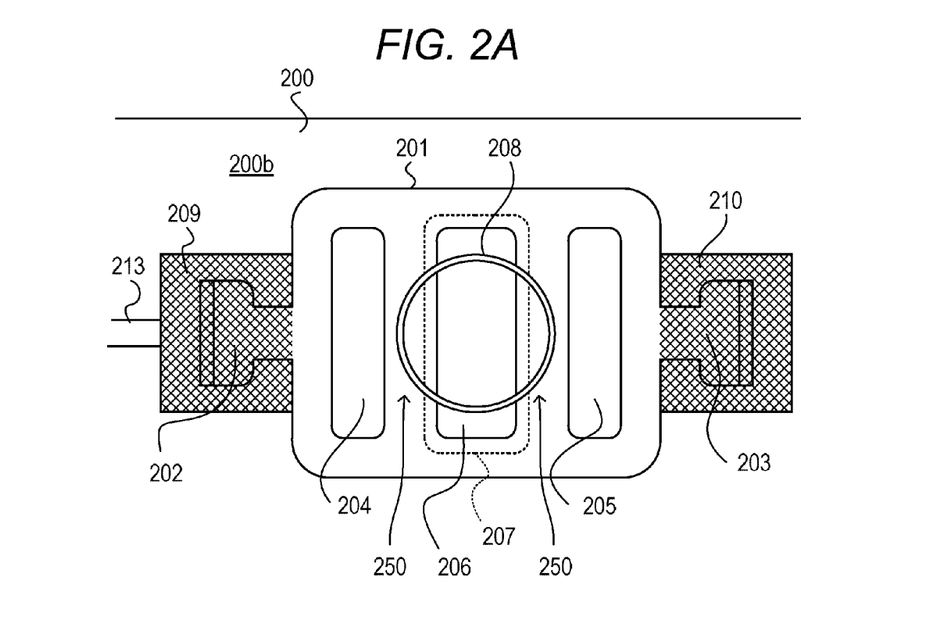
FIGS. 2A and 2B are diagrams illustrating a contact plate supporting portion of a printed circuit board according to the first embodiment.
Figure 2B:
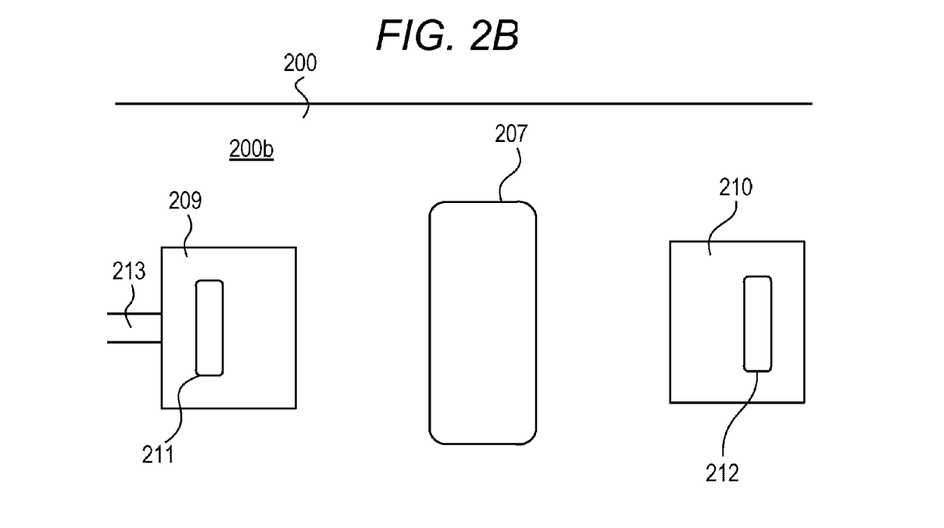

FIGS. 2A and 2B are diagrams of a portion of a high voltage power supply substrate 200 as the printed circuit board of the embodiment, in which a contact plate 201 is supported on the high voltage power supply substrate 200, as viewed from a pattern surface 200$b$ of the high voltage power supply substrate 200. In addition, the high voltage power supply substrate 200 of the embodiment will be described as a high voltage power supply substrate configured to supply a high voltage to the primary transfer rollers 105$y$, 105$m$, 105$c$, and 105$k$ of a tandem type color copying machine. Coil-spring-shaped spring contacts 208$y$, 208$m$, 208$c$, and 208$k$ as apparatus-side contacts are provided on the main body of the image forming apparatus 100. The spring contact 208$y$ is connected to the primary transfer roller 105$y$, the spring contact 208$m$ is connected to the primary transfer roller 105$m$, the spring contact 208$c$ is connected to the primary transfer roller 105$c$, and the spring contact 208$k$ is connected to the primary transfer roller 105$k$. The high voltage power supply substrate 200 is assembled to the main body of the image forming apparatus 100 so that the pattern surface 200$b$ of the high voltage power supply substrate 200 is on the far side (back side) of the main body of the image forming apparatus 100 while a component surface 200$a$ of the high voltage power supply substrate 200 is on the near side (front side) of the image forming apparatus 100.

FIG. 2A is a diagram illustrating the pattern surface 200*b* of the high voltage power supply substrate 200 on which the contact plate 201 is supported, and FIG. 2B is a diagram illustrating the pattern surface 200*b* of the high voltage power supply substrate 200 in a state in which the contact plate 201 is not supported on the pattern surface 200*b*. Soldered portions 202 and 203 of the contact plate 201 are provided on both end portions of the contact plate 201 so that the contact plate 201 is soldered on the high voltage power supply substrate 200. Contact plates 201*y*, 201*m*, 201*c*, and 201*k* are supported in the same positions as the four contact portions 801*y*, 801*m*, 801*c*, and 801*k* illustrated in FIG. 6A. Solder supporting lands 209 and 210 are provided on the high voltage power supply substrate 200 so as to solder the contact plate 201 to the high voltage power supply substrate 200. Hatched portions in FIG. 2A illustrate a state where solder is put on the solder supporting lands 209 and 210 and the solder supporting lands 209 and 210 are soldered to the soldered portions 202 and 203 of the contact plate 201. Holes 211 and 212 illustrated in FIG. 2B are opening portions through which the soldered portions 202 and 203 of the contact plate 201 are inserted into the high voltage power supply substrate 200. A circuit pattern 213 is a circuit pattern of the high voltage power supply output portion. An inspection hole 207 as a substrate-side opening portion is provided in the high voltage power supply substrate 200, for inspecting whether or not the spring contact 208 of the main body of the image forming apparatus is correctly connected to the contact plate 201 of the high voltage power supply substrate 200. In the embodiment, the inspection hole 207 has a nearly rectangular shape so that two points of the spring contact 208 can be inspected. However, the inspection hole 207 may have a circular shape so that one point of the spring contact 208 can be inspected.

Figure 3:
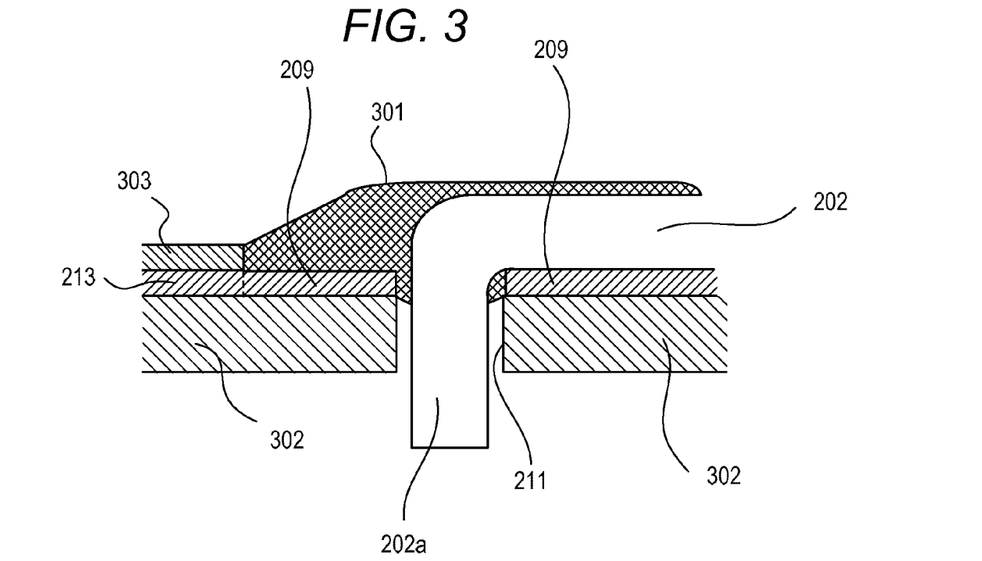
FIG. 3 is an enlarged cross-sectional view of a soldered supporting portion of a contact plate of the printed circuit board according to the first embodiment.

FIG. 3 is an enlarged cross-sectional view of a vicinity of the soldered portion 202 of the contact plate 201 of the high voltage power supply substrate 200 according to the embodiment. A resist 303 is an insulating film which covers a surface of the high voltage power supply substrate 200 so as to protect a copper foil pattern. As illustrated in FIG. 3, an end portion 202*a* of the soldered portion 202 of the contact plate 201 is bent at a substantially 90-degree angle, is inserted into the hole 211, and is soldered. The copper foil pattern provided on the left side of the soldered portion 202 of the contact plate 201 is denoted by two numerals (209 and 213). The right side of a dotted line illustrated in the copper foil pattern indicates the solder supporting land 209, and the left side of the dotted line indicates the circuit pattern 213. Because a copper foil pattern is exposed on the solder supporting land 209, solder 301 is put on a surface of the exposed copper foil pattern. However, because the surface of the copper foil pattern of the circuit pattern 213 is covered with the resist 303, the solder 301 is not put on the circuit pattern 213. The solder supporting land 209 and the circuit pattern 213 are provided on a base material 302 of the high voltage power supply substrate 200.

(Solder Flux Suppressing Hole)

As illustrated in FIG. 2A, the contact plate 201 of the embodiment is provided with solder flux suppressing holes 204 and 205 as a suppressing portion and an inspection hole 206 as a contact-plate-side opening portion. The solder flux suppressing holes 204 and 205 have the following function. Specifically, the solder flux suppressing holes 204 and 205 have the function of making a flow path of the solder flux from the soldered portions 202 and 203 to a portion 250 in which the spring contact 208 contacts the contact plate 201 (hereinafter referred to as a contact portion) longer than a straight-line distance from the soldered portions 202 and 203 to the contact portion 250. In this way, the solder flux suppressing holes 204 and 205 prevent the solder flux from adhering to the contact portion 250. The inspection hole 206 is provided in a position in which the inspection hole 206 overlaps the inspection hole 207 of the high voltage power supply substrate 200 when the contact plate 201 is soldered on the high voltage power supply substrate 200. In the embodiment, the solder flux suppressing holes 204 and 205 as opening portions are provided in the contact plate 201. The opening portions configured to prevent the flux from adhering to the contact portion 250 may include a through hole or a recess. Therefore, it is possible to lengthen an access route (the shortest path along the surface) (hereinafter referred to as a creepage path) for the solder flux, the creepage path extending from the soldered portions 202 and 203 of the contact plate 201 to the contact portion 250 on the contact plate 201 in which the contact plate 201 contacts the spring contact 208. Thus, it is possible to prevent the solder flux from flowing to the contact portion 250 on the contact plate 201. FIG. 2A shows that a rim of the inspection hole 207 illustrated by a broken line is hidden by the contact plate 201 and is not actually seen from the pattern surface (also the soldered surface) 200*b* of the high voltage power supply substrate 200.

Because the inspection hole 206 of the contact plate 201 and the inspection hole 207 of the high voltage power supply substrate 200 are provided, it is possible to inspect, from the component surface of the high voltage power supply substrate 200, a connection state between the contact plate 201 and the spring contact 208 after the high voltage power supply substrate 200 is assembled to the main body of the image forming apparatus 100. Thus, it is possible to avoid proceeding to the post process of the assembling work in an abnormal connection state between the contact plate 201 and the spring contact 208. The shape of the solder flux suppressing holes 204 and 205 is not limited to the rectangular shape illustrated in FIG. 2A but may be an elliptical shape, a slit shape, and so on. In other words, the shape and size of the solder flux suppressing holes 204 and 205 may be any shape and size as long as the creepage path of the solder flux can be extended.

In addition, the shape of the inspection hole 207 of the high voltage power supply substrate 200 and the shape of the inspection hole 206 of the contact plate 201 are not limited to the rectangular shape illustrated in FIG. 2A but may be, for example, a circular shape, a slit shape, an elliptical shape, and so on. In other words, the shape of the inspection hole 207 of the high voltage power supply substrate 200 and the shape of the inspection hole 206 of the contact plate 201 may be any shape as long as the connection between the spring contact 208 and the contact plate 201 can be inspected. In addition, a size of the inspection hole 207 of the high voltage power supply substrate 200 and a size of the inspection hole 206 of the contact plate 201 may have a relationship in which the rim defining the inspection hole 207 is equal to or larger than the rim defining the inspection hole 206. Therefore, when the rim defining the inspection hole 207 has the same size as the rim defining the inspection hole 206, it is possible to inspect whether or not the spring contact 208 and the contact plate 201 are correctly connected to each other. On the other hand, as illustrated in FIG. 2A, when the rim defining the inspection hole 207 (broken line portion) is larger than the rim defining the inspection hole 206 (solid line portion), the following two points can be inspected. Specifically, it is possible to inspect whether or not the spring contact 208 and the contact plate 201 are correctly connected to each other, and it is also possible to inspect whether or not the contact plate 201 is correctly supported on the high voltage power supply substrate 200. The inspection hole 207 of the high voltage power supply substrate 200 has a size such that the strength of the substrate is not weakened.

As described above, according to the embodiment, it is possible to suppress the flow and adhesion of the solder flux to the contact so that a contact failure of the contact can be prevented.

Second Embodiment

A printed circuit board according to a second embodiment of the present invention will be described with reference to FIGS. 4A and 4B. Similarly to the first embodiment, also in the second embodiment, the structure configured to suppress the flow of solder flux is provided in a portion of the contact plate so that, when the contact plate is soldered on the single-sided printed circuit board, the solder flux does not flow to the position in which the contact plate contacts the spring contact provided in the main body of the image forming apparatus. The image forming operation of the image forming apparatus 100 is the same as that described above with reference to FIG. 1, while the method of assembling the high voltage power supply substrate to the main body of the image forming apparatus 100 is the same as that described above with reference to FIG. 6A, and therefore the description is omitted. The second embodiment is different from the first embodiment in that the structure of the contact plate configured to suppress the flow of solder flux is changed from the solder flux suppressing holes (204 and 205) in the first embodiment to solder flux suppressing walls (404 and 405) as the suppressing portion. In the embodiment, because the suppressing walls having a bending structure are provided on the contact plate, the same effect as that of the first embodiment can be obtained.

(Structure of Contact Plate Supporting Portion)

Figure 4A:
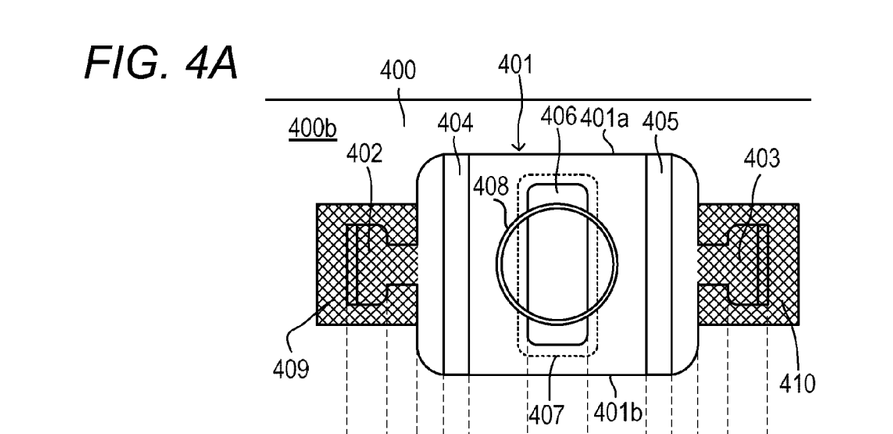
FIGS. 4A and 4B are diagrams illustrating a contact plate supporting portion of a printed circuit board according to the second embodiment.
Figure 4B:
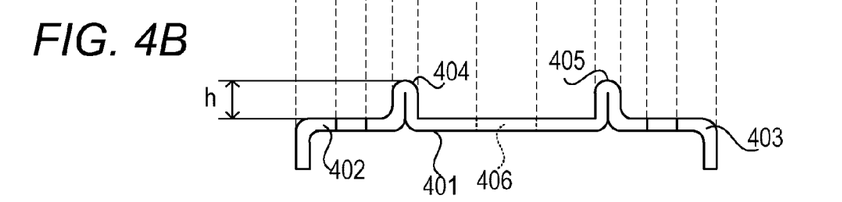

FIG. 4A is a diagram illustrating a contact plate supporting portion of a high voltage power supply substrate 400 as the printed circuit board of the embodiment. FIG. 4A is a diagram of a portion of the high voltage power supply substrate 400 on which a contact plate 401 is supported, as viewed from the pattern surface of the high voltage power supply substrate 400, and FIG. 4B is a side view of the contact plate 401. The high voltage power supply substrate 400 is configured to supply a high voltage to the primary transfer rollers 105*y*, 105*m*, 105*c*, and 105*k* of the tandem type image forming apparatus 100. A coil-spring-shaped spring contact 408 is provided in the main body of the image forming apparatus 100. The high voltage power supply substrate 400 is assembled to the main body of the image forming apparatus 100 so that a pattern surface 400*b* of the high voltage power supply substrate 400 is on the far side of the main body of the image forming apparatus 100 while the component surface of the high voltage power supply substrate 400 is (facing outward) on the near side of the image forming apparatus 100. Soldered portions 402 and 403 of the contact plate 401 are provided on both end portions of the contact plate 401 so that the contact plate 401 is soldered on the high voltage power supply substrate 400. Contact plates 401*y*, 401*m*, 401*c*, and 401*k* are supported in the same positions as the four contact portions 801*y*, 801*m*, 801*c*, and 801*k* illustrated in FIG. 6A. Solder supporting lands 409 and 410 are provided on the high voltage power supply substrate 400 so as to solder the contact plate 401 to the high voltage power supply substrate 400. Hatched portions in FIG. 4A illustrate a state in which solder is put on the solder supporting lands 409 and 410 and the solder supporting lands 409 and 410 are soldered on the soldered portions 402 and 403 of the contact plate 401.

The contact plate 401 of the embodiment is provided with the solder flux suppressing walls 404 and 405 as wall portions and an inspection hole 406. In the embodiment, the solder flux suppressing walls 404 and 405 are formed as protrusions in a manner that the contact plate 401 is bent from a surface of the contact plate 401 toward the main body of the image forming apparatus 100 at an approximately 90° angle, and bent at a 180° angle at a predetermined length, and further bent at a 90° angle at the predetermined length. In the embodiment, the solder flux suppressing walls 404 and 405 are provided to be perpendicular to the contact plate 401, but this is not a limitation as long as the solder flux suppressing walls 404 and 405 have a protruding shape. In this way, because the contact plate 401 is provided with the solder flux suppressing walls 404 and 405, it is possible to lengthen a creepage path from the soldered portions 402 and 403 of the contact plate 401 to the contact portion on the contact plate 401. With this, it is possible to prevent the solder flux from flowing to the contact portion on the contact plate 401.

In FIG. 4A, a rim of an inspection hole 407 illustrated by a broken line indicates that the rim of the inspection hole 407 is hidden by the contact plate 401 and is not actually seen from the pattern surface 400*b* of the high voltage power supply substrate 400. Because the inspection hole 406 of the contact plate 401 and the inspection hole 407 of the high voltage power supply substrate 400 are provided, it is possible to inspect the connection state between the spring contact 408 and the contact plate 401 from the component surface of the high voltage power supply substrate 400 after the high voltage power supply substrate 400 is assembled to the main body of the image forming apparatus 100. In this way, it is possible to avoid proceeding to the post process of the assembling work in an abnormal connection state between the contact plate 401 and the spring contact 408. The shapes and sizes of the inspection hole 407 of the high voltage power supply substrate 400 and the inspection hole 406 of the contact plate 401 are the same as those described in the first embodiment, and the description is thus omitted.

Here, as illustrated in FIG. 4A, the solder flux suppressing walls 404 and 405 of the embodiment extend to both side end portions 401*a* and 401*b* of the contact plate 401. However, the solder flux suppressing walls 404 and 405 need not extend to the both side end portions 401*a* and 401*b* of the contact plate 401 as long as an elongation of the creepage path of the solder flux can be secured. In addition, a height "h" of the solder flux suppressing walls 404 and 405 (the predetermined length at which the walls are bent at the 180° angle) only needs to be such a height that, when the spring contact 408 is brought into contact with the contact plate 401, the contact of the spring contact 408 with the contact plate 401 is not impeded. Here, the height "h" of the solder flux suppressing walls 404 and 405 is a length in the direction perpendicular to the pattern surface 400*b* of the high voltage power supply substrate 400. The solder flux suppressing walls 404 and 405 are formed into a protruding shape by bending the contact plate 401 in the embodiment, but it is possible to provide the suppressing wall by attaching a separate member perpendicularly to the surface of the contact plate 401. Further, in the embodiment, the contact plate 401 protrudes to the direction toward the main body of the image forming apparatus 100 so as to form the wall structure. However, the contact plate 401 may be recessed toward the high voltage power supply substrate 400 to form, for example, a U-shaped groove portion, and the groove portion may be formed to be long as the flow path of the solder flux so that the creepage distance may be elongated.

As described above, according to the embodiment, it is possible to suppress the flow and adhesion of the solder flux to the contact so that a contact failure of the contact can be prevented.

Third Embodiment

A high voltage power supply substrate 500 according to a third embodiment will be described with reference to FIG. 4C. Similarly to the first embodiment, also in the third embodiment, the structure configured to suppress the flow of solder flux is formed in a portion of the contact plate so that, when the contact plate is soldered on the single-sided printed circuit board, the solder flux does not flow to the position in which the contact plate contacts the spring contact provided in the main body of the image forming apparatus. Further, the image forming operation of the image forming apparatus 100 is the same as that described above with reference to FIG. 1, while the method of assembling the high voltage power supply substrate 500 to the main body of the image forming apparatus 100 is the same as that described above with reference to FIG. 6A, and therefore the description is omitted. The third embodiment is different from the first embodiment in the following point. Specifically, the inspection structure provided in the contact plate for inspecting the contact state between the spring contact provided in the main body of the image forming apparatus 100 and the contact plate is changed from the inspection hole (206) to inspection portions (506 and 511) having cut-away portions. The structure of the contact plate of the third embodiment can also produce the same effect as that of the first embodiment.

(Structure of Contact Plate Supporting Portion)

Figure 4C:
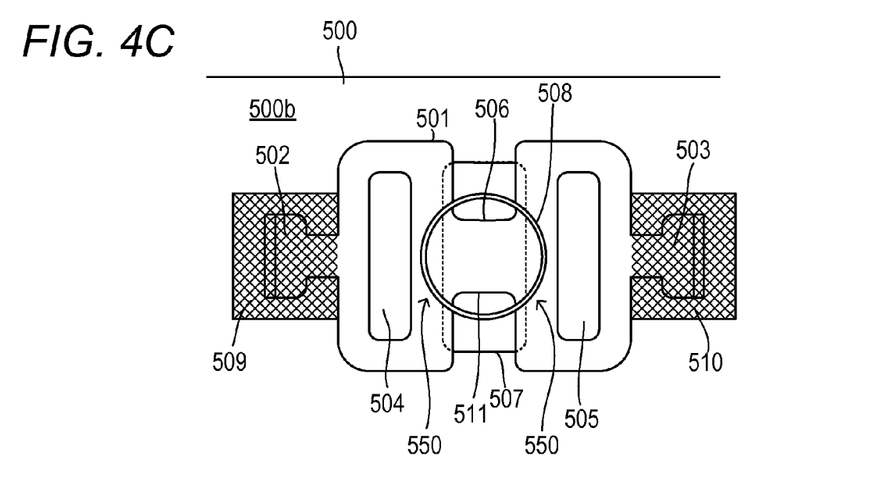
FIG. 4C is a diagram illustrating a contact plate supporting portion of a printed circuit board according to the third embodiment.

FIG. 4C is a diagram of a portion of the high voltage power supply substrate 500 of the third embodiment, in which a contact plate 501 is supported on the high voltage power supply substrate 500 as the printed circuit board, as viewed from a pattern surface 500b of the high voltage power supply substrate 500. The high voltage power supply substrate 500 of the embodiment is configured to supply a high voltage to the primary transfer rollers 105y, 105m, 105c, and 105k of the tandem type color copying machine. A coil-spring-shaped spring contact 508 is provided in the main body of the image forming apparatus 100. The high voltage power supply substrate 500 is assembled to the main body of the image forming apparatus 100 so that a pattern surface 500b of the high voltage power supply substrate 500 is on the far side of the main body of the image forming apparatus 100 while the component surface of the high voltage power supply substrate 500 is (facing outward) on the near side of the image forming apparatus.

Soldered portions 502 and 503 of the contact plate 501 are provided on both end portions of the contact plate 501 so that the contact plate 501 is soldered on the high voltage power supply substrate 500. The contact plate 501 is supported in the same position as the four contact portions 801y, 801m, 801c, and 801k illustrated in FIG. 6A. Solder supporting lands 509 and 510 are provided on the high voltage power supply substrate 500 so as to solder the contact plate 501 to the high voltage power supply substrate 500. Hatched portions in FIG. 4C illustrate a state in which solder is put on the solder supporting lands 509 and 510 and the solder supporting lands 509 and 510 are soldered on the soldered portions 502 and 503 of the contact plate 501.

The contact plate 501 of the embodiment is provided with solder flux suppressing holes 504 and 505, and the inspection portions 506 and 511 having cut-away portions. In the embodiment, because the contact plate 501 is provided with the solder flux suppressing holes 504 and 505, it is possible to lengthen a creepage path from the soldered portions 502 and 503 of the contact plate 501 to a contact portion 550 on the contact plate 501. In this way, it is possible to prevent the solder flux from flowing to the contact portion 550 on the contact plate 501. The shape and size of the solder flux suppressing holes 504 and 505 are the same as those described above in the first embodiment, and the description is thus omitted.

In FIG. 4C, a portion of an inspection hole 507 illustrated by a broken line indicates that the portion of the inspection hole 507 is hidden by the contact plate 501 and is not actually seen from the pattern surface 500b of the high voltage power supply substrate 500. In this way, the embodiment has the structure including the inspection portions 506 and 511 of the contact plate 501 and the inspection hole 507 of the high voltage power supply substrate 500. With this, it is possible to inspect the connection state between the spring contact 508 and the contact plate 501 from the component surface of the high voltage power supply substrate 500 after the high voltage power supply substrate 500 is assembled to the main body of the image forming apparatus 100. Therefore, it is possible to avoid proceeding to the post process of the assembling work in an abnormal connection state between the contact plate 501 and the spring contact 508.

A shape and a size of the cut-away portions of the inspection portions 506 and 511 of the contact plate 501 in the embodiment are not limited to those illustrated in FIG. 4C but may be any shape and size as long as the connection state between the contact plate 501 and the spring contact 508 can be inspected. In addition, in the embodiment, because the inspection portions 506 and 511 of the contact plate 501 have the cut-away portions, even when a width of the inspection hole 507 is smaller than a width of the inspection portions 506 and 511, it is possible to inspect whether or not the contact plate 501 is correctly supported on the high voltage power supply substrate 500. The widths of the cut-away portions of the inspection portions 506 and 511 and the width of the inspection hole 507 correspond to lengths of the inspection portions 506 and 511 and the inspection hole 507 in the direction of the solder flux flow (the horizontal direction in FIG. 4C).

As described above, according to the embodiment, it is possible to suppress the flow and adhesion of the solder flux to the contact so that a contact failure of the contact can be prevented.

Fourth Embodiment

A high voltage power supply substrate according to a fourth embodiment of the present invention will be described with reference to FIGS. 4D and 4E. Similarly to the second embodiment, also in the fourth embodiment, the structure configured to suppress the flow of solder flux is provided in a portion of the contact plate so that, when the contact plate is soldered on the high voltage power supply substrate, the solder flux does not flow to the position in which the contact plate contacts the spring contact provided in the main body of the image forming apparatus 100. The image forming operation of the image forming apparatus 100 is the same as that described above with reference to FIG. 1, while the method of assembling the high voltage power supply substrate to the main body of the image forming apparatus 100 is the same as that described above with reference to FIG. 6A, and therefore the description is omitted. The embodiment is different from the second embodiment in the following point. Specifically, the structure of the inspection portion formed in the contact plate for inspecting the contact state between the spring contact provided in the main body of the image forming apparatus 100 and the contact plate is changed from the inspection hole (206) to inspection portions (606 and 611) having cut-away portions. A contact plate 601 of the fourth embodiment also produces the same effect as that of the second embodiment.

(Structure of Contact Plate Supporting Portion)

Figure 4D:
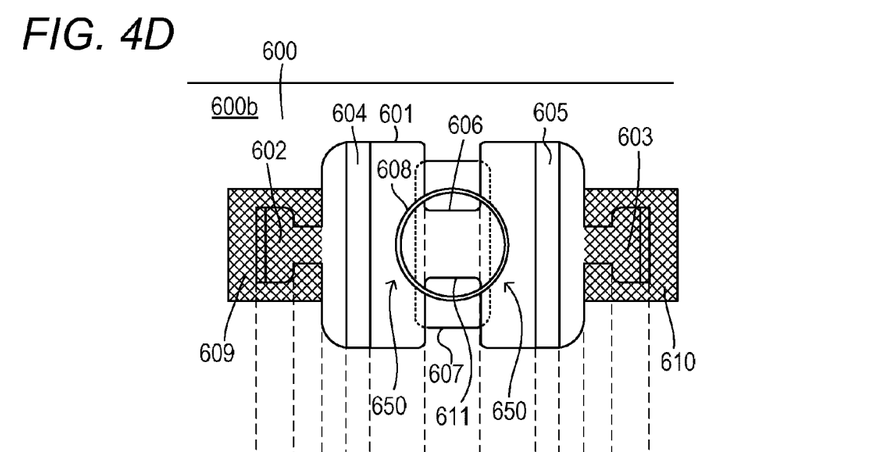
FIGS. 4D and 4E are diagrams illustrating a contact plate supporting portion of a printed circuit board according to the fourth embodiment.
Figure 4E:
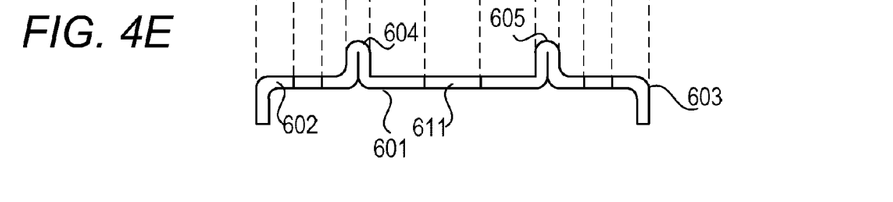

FIG. 4D is a diagram illustrating the contact plate supporting portion of a high voltage power supply substrate 600 according to the fourth embodiment. FIG. 4D is a diagram of a portion of the high voltage power supply substrate 600 on which the contact plate 601 is supported, as viewed from a pattern surface 600b of the high voltage power supply substrate 600, and FIG. 4E is a side view of the contact plate 601. The high voltage power supply substrate 600 is configured to supply a high voltage to the primary transfer rollers 105y, 105m, 105c, and 105k of the tandem type color copying machine. Soldered portions 602 and 603 of the contact plate 601 are provided on both end portions of the contact plate 601 so that the contact plate 601 is soldered on the high voltage power supply substrate 600. The contact plate 601 is supported in the same position as the four contact portions 801y, 801m, 801c, and 801k illustrated in FIG. 6A. Solder supporting lands 609 and 610 are provided on the high voltage power supply substrate 600 so as to solder the contact plate 601 to the high voltage power supply substrate 600. Hatched portions in FIG. 4D illustrate a state in which solder is put on the solder supporting lands 609 and 610 and the solder supporting lands 609 and 610 are soldered on soldered portions 602 and 603 of the contact plate 601.

The contact plate 601 of the embodiment is provided with solder flux suppressing walls 604 and 605, and the inspection portions 606 and 611 having cut-away portions. Because the contact plate 601 is provided with the solder flux suppressing walls 604 and 605, it is possible to lengthen a creepage path from the soldered portions 602 and 603 of the contact plate 601 to a contact portion 650 on the contact plate 601. In this way, it is possible to prevent the solder flux from flowing to the contact portion 650 on the contact plate 601. The shape and height of the solder flux suppressing walls 604 and 605 are the same as those described above in the second embodiment, and the description is thus omitted.

In FIG. 4D, a portion of an inspection hole 607 illustrated by a broken line indicates that the portion of the inspection hole 607 is hidden by the contact plate 601 and is not actually seen from the pattern surface 600b of the high voltage power supply substrate 600. Because the inspection portions 606 and 611 of the contact plate 601 and the inspection hole 607 of the high voltage power supply substrate 600 are provided, it is possible to inspect the following two points. Specifically, after the high voltage power supply substrate 600 is assembled to the main body of the image forming apparatus 100, a connection state between a spring contact 608 and the contact plate 601 can be inspected from the component surface of the high voltage power supply substrate 600. In addition, it is also possible to inspect whether or not the contact plate 601 is correctly supported on the high voltage power supply substrate 600. In this way, it is possible to avoid proceeding to the post process of the assembling work in an abnormal connection state between the contact plate 601 and the spring contact 608.

As described above, according to the embodiment, it is possible to suppress the flow and adhesion of the solder flux to the contact so that a contact failure of the contact can be prevented.

Further, in the first to fourth embodiments described above, the high voltage power supply substrate for the primary transfer is described. However, it is possible to use the same structure as a contact structure of an output portion of other high voltage power supply for developing, primary charging, secondary transfer, and so on. In addition, it is possible to form a plurality of types of high voltage power supply circuits on a single printed circuit board, and to use the same structure according to one of the first to fourth embodiments for each high voltage power supply. In addition, in the first to fourth embodiments, the single-sided printed circuit board is used as the high voltage power supply substrate, but a double-sided printed circuit board or a multilayered printed circuit board can be used as the high voltage power supply substrate. Further, in the first to fourth embodiments, the tandem type color image forming apparatus including the intermediate transfer belt is described. However, the present invention is not limited to this type of the image forming apparatus. For instance, it is possible to apply the present invention to high voltage power supply substrates of various types of image forming apparatus such as an image forming apparatus including a recording material conveying belt, a rotary type image forming apparatus, and a monochrome image forming apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-155726, filed Jul. 26, 2013, which is hereby incorporated by reference herein in its entirety.

What is claimed is:

1. A printed circuit board, comprising:
   a substrate on which a component which constitutes a circuit is configured to generate a high voltage is mounted by solder; and
   a contact plate including a soldered portion soldered on the substrate, the contact plate being configured to be brought into contact with a spring contact, to which the high voltage is applied, mounted in an apparatus to which the substrate is to be attached,
   wherein the contact plate is attached to the substrate by the soldered portion being soldered on a surface of the substrate opposite to a surface of the substrate on which the component is mounted, and
   wherein the contact plate includes a suppressing portion configured to suppress an adhesion of a flux of the solder to a contact portion in which the contact plate is to be contacted by the spring contact, the suppressing portion making a creeping distance of the contact plate on which the flux of the solder flows from the soldered portion to the contact portion longer than a straight-line distance from the soldered portion to the contact portion.

2. A printed circuit board according to claim 1, wherein the suppressing portion comprises an opening portion formed in the contact plate.

3. A printed circuit board according to claim 2, wherein the opening portion has a nearly rectangular shape.

4. A printed circuit board according to claim 1, wherein the suppressing portion comprises a wall portion provided on the contact plate.

5. A printed circuit board according to claim 4, wherein the wall portion is formed by protruding a portion of the contact plate toward the apparatus.

6. A printed circuit board according to claim 1,
wherein the substrate comprises a substrate opening portion through which a connection state between the spring contact and the contact plate is visible, and
wherein the contact plate comprises a contact plate opening portion provided in a position in which the contact plate opening portion overlaps the substrate opening portion when the contact plate is attached to the substrate.

7. A printed circuit board according to claim 6, wherein the substrate opening portion and the contact plate opening portion are provided so that two points of the spring contact are visible.

8. A printed circuit board according to claim 6, wherein the substrate opening portion is formed to have a size equal to or larger than a size of the contact plate opening portion.

9. A printed circuit board according to claim 6, wherein the substrate opening portion and the contact plate opening portion each has a nearly rectangular shape.

10. A printed circuit board according to claim 1,
wherein the substrate comprises a substrate opening portion through which a connection state between the spring contact and the contact plate is visible, and
wherein the contact plate comprises a cut-away portion provided in a position in which the cut-away portion overlaps a portion of the substrate opening portion when the contact plate is attached to the substrate.

11. A printed circuit board according to claim 10, wherein the cut-away portion is provided in each of two positions of the contact plate so that two points of the spring contact are visible.

12. A printed circuit board according to claim 1, wherein the substrate comprises:
a land to which the soldered portion is soldered; and
an opening portion into which a portion of the soldered portion is inserted.

13. An image forming apparatus configured to form an image on a recording material, the image forming apparatus comprising:
a high voltage generating circuit configured to generate a high voltage; and
an image forming unit including a spring contact to which the high voltage generated by the high voltage generating circuit is supplied, the image forming unit being configured to form the image on the recording material with use of the high voltage supplied through the spring contact,
wherein the high voltage generating circuit comprises:
a substrate on which a component which constitutes a circuit configured to generate a high voltage is mounted by solder; and
a contact plate including a soldered portion soldered on the substrate, the contact plate being configured to be brought into contact with the spring contact,
wherein the contact plate is attached to the substrate by the soldered portion being soldered on a surface of the substrate opposite to a surface of the substrate on which the component is mounted, and
wherein the contact plate includes a suppressing portion configured to suppress an adhesion of a flux of the solder to a contact portion in which the contact plate is to be contacted by the spring contact, the suppressing portion making a creeping distance of the contact plate on which the flux of the solder flows from the soldered portion to the contact portion longer than a straight-line distance from the soldered portion to the contact portion.

14. An image forming apparatus according to claim 13, wherein the image forming unit comprises:
an image bearing member;
a charging unit configured to charge the image bearing member;
an exposing unit configured to expose the image bearing member so as to form a latent image on the image bearing member charged by the charging unit;
a developing unit configured to develop the latent image into a toner image; and
a transfer unit configured to transfer the toner image developed by the developing unit onto the recording material,
wherein the high voltage generating circuit is configured to supply the high voltage to at least one of the charging unit, the developing unit, and the transfer unit.

15. An image forming apparatus according to claim 14, wherein the substrate is attached to a main body of the image forming apparatus so that the surface of the substrate opposite to the surface of the substrate on which the component is mounted is on a back side of the main body of the image forming apparatus and the surface of the substrate on which the component is mounted is on a front side of the main body of the image forming apparatus.

* * * * *